(12) United States Patent
Kim et al.

(10) Patent No.: US 10,249,689 B2
(45) Date of Patent: Apr. 2, 2019

(54) COLOR-CONVERSION PANEL, METHOD OF MANUFACTURING THE PANEL, AND DISPLAY DEVICE INCLUDING THE PANEL

(71) Applicant: Samsung Display Co., Ltd., Yongin-si, Gyeonggi-do (KR)

(72) Inventors: Dong-Uk Kim, Hwaseong-si (KR); Kwang Keun Lee, Osan-si (KR); Hae Il Park, Seoul (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/618,690

(22) Filed: Jun. 9, 2017

(65) Prior Publication Data
US 2018/0006093 A1    Jan. 4, 2018

(30) Foreign Application Priority Data
Jun. 29, 2016 (KR) .................. 10-2016-0081557

(51) Int. Cl.
| | |
|---|---|
| *H01L 27/32* | (2006.01) |
| *G03F 7/00* | (2006.01) |
| *G02B 5/30* | (2006.01) |
| *H01L 33/06* | (2010.01) |
(Continued)

(52) U.S. Cl.
CPC .......... *H01L 27/322* (2013.01); *G02B 5/3041* (2013.01); *G02F 1/133514* (2013.01); *G03F 7/0007* (2013.01); *H01L 33/06* (2013.01); *G02F 2001/133614* (2013.01); *G02F 2202/36* (2013.01); *H01L 27/156* (2013.01); *H01L 27/3244* (2013.01); *H01L 2251/5369* (2013.01)

(58) Field of Classification Search
CPC ....... H01L 33/06; H01L 27/322; G02B 5/201; G02B 5/223; G02B 5/206; G02B 5/207; G02F 1/133514; G02F 1/133516; G03F 7/0007
USPC ............................................... 430/7; 349/106
See application file for complete search history.

(56) References Cited

U.S. PATENT DOCUMENTS

| | | | |
|---|---|---|---|
| 7,750,984 B2 | 7/2010 | Ha et al. | |
| 2013/0242228 A1* | 9/2013 | Park ................. | G02F 1/133617 349/61 |
| 2014/0204319 A1 | 7/2014 | Cai et al. | |

(Continued)

FOREIGN PATENT DOCUMENTS

| | | | |
|---|---|---|---|
| CN | 105097878 A | * | 11/2015 |
| KR | 10-2010-0089606 A | | 8/2010 |

(Continued)

OTHER PUBLICATIONS

EP Search Report corresponding to European Patent Application No. 17178504.1, dated Oct. 31, 2017, 11 pages.

*Primary Examiner* — John A McPherson
(74) *Attorney, Agent, or Firm* — Innovation Counsel LLP

(57) ABSTRACT

A color conversion panel according to an exemplary embodiment of the present invention includes: a substrate; a first color filter and a second color filter adjacent to the first color filter disposed on the substrate; a first color conversion layer disposed on the first color filter; and a second color conversion layer disposed on the second color filter, wherein each of the first color conversion layer and the second color conversion layer includes at least two quantum dots representing different colors, and wherein the first color filter displays a different color from the second color filter.

20 Claims, 9 Drawing Sheets

(51) Int. Cl.
   *G02F 1/1335*   (2006.01)
   *H01L 27/15*    (2006.01)

(56) References Cited

U.S. PATENT DOCUMENTS

| | | |
|---|---|---|
| 2015/0048348 A1 | 2/2015 | Huang et al. |
| 2015/0185381 A1* | 7/2015 | Wu .................. G02B 5/201 349/106 |
| 2015/0331165 A1* | 11/2015 | Ryu .................. G02B 5/223 362/610 |
| 2016/0061417 A1 | 3/2016 | Kim et al. |
| 2016/0070137 A1 | 3/2016 | You et al. |
| 2017/0179438 A1* | 6/2017 | Xu .................. H01L 51/5281 |

FOREIGN PATENT DOCUMENTS

| | | |
|---|---|---|
| KR | 10-2012-0001387 A | 1/2012 |
| KR | 10-2012-0133062 A | 12/2012 |
| KR | 10-2016-0000569 A | 1/2016 |

\* cited by examiner

COLOR-CONVERSION PANEL, METHOD OF MANUFACTURING THE PANEL, AND DISPLAY DEVICE INCLUDING THE PANEL

CROSS-REFERENCE TO RELATED APPLICATION

This application claims priority to and the benefit of Korean Patent Application No. 10-2016-0081557 filed in the Korean Intellectual Property Office on Jun. 29, 2016; the entire contents of the Korean Patent Application are incorporated herein by reference.

BACKGROUND

(a) Technical Field

The technical field relates to a color-conversion panel, a method for manufacturing the color-conversion panel, and a display device including the color-conversion panel.

(b) Description of the Related Art

A display device may include a light source and a color-conversion panel. Light generated by the light source may be converted by the color-conversion panel into lights of predetermined colors, such that a color image may be displayed. Nevertheless, the color-conversion panel may significantly reflect external light. As a result, a contrast ratio associated with the displayed image may be unsatisfactory.

The Background section is for enhancement of understanding of related background and may contain information not already known in this country.

SUMMARY

Embodiments are related to a color-conversion panel (or color conversion panel) that may enable satisfactory contrast ratios associated with display images, a method for manufacturing the color-conversion panel, and a display device including the color-conversion panel.

Embodiments may reduce process steps to reduce manufacturing time and cost.

A color conversion panel according to an embodiment includes the following elements: a substrate; a first color filter and a second color filter adjacent to the first color filter disposed on the substrate; a first color conversion layer disposed on the first color filter; and a second color conversion layer disposed on the second color filter, wherein each of the first color conversion layer and the second color conversion layer includes at least two quantum dots representing (and/or displaying) different colors, and wherein the first color filter displays a different color from the second color filter.

The first color conversion layer and the second color conversion layer may have substantially the same thickness.

The at least two quantum dots may include a red quantum dot and a green quantum dot.

The color conversion panel may further include a third layer disposed on the substrate, wherein the third color layer displays a different color from the first color filter and the second color filter.

The third color layer may comprise a set of light-scattering members configured to scatter light.

The third color layer may further comprise a blue pigment

The third color layer may be thicker than each of the first color conversion layer and the second color conversion layer.

The third color layer may comprise a third color filter and a third color conversion layer disposed on the third color filter, wherein the third color conversion layer includes a blue quantum dot The first color conversion layer, the second color conversion layer, and the third color conversion layer may respectively include a red quantum dot, a green quantum dot, and a blue quantum dot.

The third color conversion layer may directly contact the third color filter, and wherein the first color conversion layer, the second color conversion layer, and the third color conversion layer have substantially the same thickness.

A manufacturing method of a color conversion panel according to an embodiment includes the following steps: forming a first color filter and a second color filter on a substrate; forming a color conversion material layer on the substrate to cover the first color filter and the second color filter; and patterning (and/or partially removing) the color conversion material layer to form a first color conversion layer on the first color filter and a second color conversion layer on the second color filter, wherein each of the first color conversion layer and the second color conversion layer includes at least two quantum dots representing different colors and wherein the first color filter displays a different color from the second color filter.

The at least two quantum dots may include a red quantum dot and a green quantum dot.

The method may include forming a third color layer on the substrate, wherein the third color layer displays a different color from the first color filter and the second color filter.

The color conversion material layer may cover the third color layer.

The first color conversion layer and the second color conversion layer may be simultaneously formed.

Forming a third color layer may comprise forming a third color filter on the substrate, and patterning the color conversion material layer to form a third color conversion layer on the third color filter, and the first color conversion layer, the second color conversion layer, and the third color conversion layer may each include a red quantum dot, a green quantum dot, and a blue quantum dot.

The first color conversion layer, the second color conversion layer, and the third color conversion layer may be simultaneously formed.

A display device according to an embodiment includes the following elements: a display panel; and a color conversion panel overlapping the display panel, wherein the color conversion panel includes a substrate, a first color filter and a second color filter disposed at one surface of the substrate toward the display panel, a first color conversion layer disposed at one surface of the first color filter toward the display panel, and a second color conversion layer disposed at one surface of the second color filter toward the display panel, wherein each of the first color conversion layer and the second color conversion layer includes at least two quantum dots representing different colors, and wherein the first color filter displays a different color from the second color filter.

According to embodiments, a color-conversion panel may enable a satisfactory viewing angle and/or satisfactory color reproducibility associated with a display device.

According to embodiments, a structure of color filters and color conversion layers in a color-conversion panel may enable satisfactory contrast ratios associated with displayed images by minimizing external light reflection.

According to embodiments, a process step for forming color conversion layers may be simplified. Advantageously, manufacturing time and cost may be reduced.

DETAILED DESCRIPTION OF EMBODIMENTS

Figure 1:
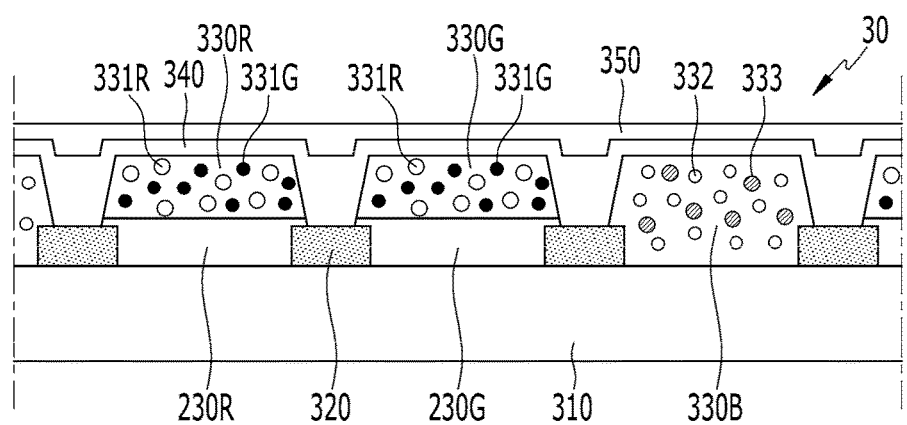
FIG. 1 is a cross-sectional view of a color-conversion panel (or color conversion panel) according to an embodiment.

Embodiments are described with reference to the accompanying drawings. As those skilled in the art would realize, the described embodiments may be modified in various different ways.

In the drawings, for better understanding and ease of description, thicknesses and/or sizes of some layers and/or areas may be exaggerated.

Although the terms "first", "second", etc. may be used herein to describe various elements, these elements, should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

When a first element (such as a layer, film, region, or substrate) is referred to as being "on" a second element, the first element can be directly on the second element, or an intervening element may also be present between the first element and the second element. When a first element is referred to as being "directly on" a second element, there are no intended intervening elements present between the first element and the second element.

FIG. 1 is a cross-sectional view of a color-conversion panel (or color conversion panel) according to an embodiment.

Referring to FIG. 1, a color-conversion panel 30 (or color conversion panel 30) according to an embodiment includes a first color filter 230R, a second color filter 230G, and a light blocking member 320 disposed on a substrate 310. A first color-conversion layer 330R (or first color conversion layer) 330R may be disposed on the first color filter 230R, a second color-conversion layer 330G (or second color conversion layer 330G) may be disposed on the second color filter 230G, and the light blocking member 320 may be disposed between the first color filter 230R and the second color filter 230G. A transmission layer 330B (or blue-color layer 330B) may be disposed on the substrate 310 and spaced from each of the first color filter 230R and the second color filter 230G. A light blocking member 320 may be disposed between the second color filter 230G and the first color filter 230R, and a light blocking member 320 between the transmission layer 330B and the second color filter 230G. In this way, the light blocking members 320 may isolate operations of the first color conversion layer 330R, the second color conversion layer 330G, and the transmission layer 330B. In embodiments, each of the color conversion layers 330R and 330G and the transmission layer 330B may include a photosensitive resin.

Although not shown, copies of the first color filter 230R, the second color filter 230G, and the transmission layer 330B may be repeatedly arranged in a direction that is substantially horizontal to an upper surface of the substrate 310. The first color filter 230R may be a red color filter, and the second color filter 230G may be a green color filter.

A capping layer 340 may be disposed on the light blocking member 320, the color conversion layers 330R and 330G and the transmission layer 330B. The capping layer 340 may be formed for preventing the color conversion layers 330R and 330G and the transmission layer 330B from being damaged by processes that are performed after the color conversion layers 330R and 330G and the transmission layer 330B have been formed. In embodiments, the capping layer 340 may protect quantum dots in color conversion layers 330R and 330G against moisture and/or high temperatures.

The capping layer 340 may be an inorganic material, for example, silicon nitride. In an embodiment, the capping layer 340 may be unnecessary.

A planarization layer 350 may be disposed on the capping layer 340 and may minimize height/thickness variation of the color-conversion panel 30. The planarization layer 350 may be unnecessary in some embodiments.

In embodiments, each of the first color conversion layer 330R and the second color conversion layer 330G includes at least two quantum dots representing and/or displaying different colors. For example, the first color conversion layer 330R may include a first set of red quantum dots 331R and a first set of green quantum dots 331G. Light incident to the first color conversion layer 330R is converted into a first red light and a first green light by the red quantum dots 331R and the green quantum dots 331G, and the first red light and the first green light may be emitted from the first color conversion layer 330R.

The second color conversion layer 330G, like the first color conversion layer 330R, includes a second set of red quantum dots 331R and a second set of green quantum dots 331G. Light incident to the second color conversion layer 330G is converted into a second red light and a second green light by the red quantum dots 331R and green quantum dots 331G, and the second red light and the second green light may be emitted from the second color conversion layer 330G.

In embodiments, since the first color conversion layer 330R and the second color conversion layer 330G equally include the red quantum dot 331R and the green quantum dot 331G, light provided from the first color conversion layer 330R may display the same color as light provided from the second color conversion layer 330G. For displaying different colors, the first color filter 230R and the second color filter 230G are respectively disposed between the substrate 310 and the first color conversion layer 330R and between the substrate 310 and the second color conversion layer 330G.

The quantum dots according to embodiments may be formed of and/or include one or more of a group II-VI compound, a group III-V compound, a group IV-VI compound, a group IV element, and a group IV compound.

The group II-VI compound may be/include one or more of CdSe, CdTe, ZnS, ZnSe, ZnTe, ZnO, HgS, HgSe, HgTe, MgSe, MgS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, HgZnTeS, CdZnSeS, CdZnSeTe, CdZnSTe, CdHgSeS, CdHgSeTe, CdHgSTe, HgZnSeS, HgZnSeTe, HgZnSTe, etc. The group III-V compound may be/include one or more of GaN, GaP, GaAs, GaSb, AlN, AlP, AlAs, AlSb, InN, InP, InAs, InSb, GaNP, GaNAs, GaNSb, GaPAs, GaPSb, AlINP, AlNAs, AlNSb, AlPAs, AlPSb, InNP, InNAs, InNSb, InPAs, InPSb, GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, etc. The group IV-VI compound may be/include one or more of SnS, SnSe, SnTe, PbS, PbSe, PbTe, SnSeS, SnSeTe, SnSTe, PbSeS, PbSeTe, PbSTe, SnPbS, SnPbSe, SnPbTe, SnPbSSe, SnPbSeTe, SnPbSTe, etc. The group IV element may be/include one or more of Si, Ge, etc. The group IV compound may be/include one or more of SiC, SiGe, etc.

In embodiments, the concentration and/or distribution of a two-element compound, a three-element compound, or a four-element compound in a quantum dot may be substantially uniform. In embodiments, a quantum dot may include portions that have different concentrations and/or distributions of a compound. In an embodiment, a quantum dot may have a core/shell structure where a shell encloses a core. An interface between the core and the shell may have a concentration gradient such that a concentration of an element existing in the shell gradually decreases closer to a center of the core.

The quantum dot may have a full width at half maximum (FWHM) of the light-emitting wavelength spectrum that is less than about 45 nm, preferably less than about 40 nm, and more preferably less than about 30 nm. Advantageously, color purity and/or color reproducibility may be improved. In embodiments, since light emitted via the quantum dot is emitted in various directions, a viewing angle of a display device that includes the color-conversion panel 30 may be maximized.

In embodiments, quantum dots may have a spherical shape, a pyramidal shape, a multi-arm shape, and/or a cubic shape, and/or may be/include one or more of a nanoparticle, a nanotube, a nanowire, a nanofiber, a planar nano-particle, etc.

The first color conversion layer 330R and the second color conversion layer 330G may have substantially the same thickness (with no significant thickness difference) and may be simultaneously formed.

The transmission layer 330B may transmit blue light. The transmission layer 330B may be formed of a polymer material and may include no quantum dot. The transmission layer 330B may include a set of scattering members 332. The scattering members 332 may scatter the light incident to the transmission layer 330B to increase an amount of light emitted from the transmission layer 330B and/or to make frontal luminance and lateral luminance uniform. Although not shown, to scatter the incident light, at least one of the first color conversion layer 330R and the second color conversion layer 330G may further include scattering members analogous to or identical to scattering members 332.

The scattering member 332, as an example, may include at least one of $TiO_2$, $Al_2O_3$, and $SiO_2$.

The transmission layer 330B may further include a blue pigment 333. The blue pigment 333 may minimize reflection of external light. Advantageously, contrast ratios associated with displayed images may be optimized. The blue pigment 333 may absorb at least one of red light and green light included in the external light.

As described above, the color conversion panel 30 includes quantum dots that may enable a wide viewing angle and/or high color reproducibility, and the color conversion panel 30 includes the light-absorbing blue-color layer 330B for optimizing contrast ratios associated with displayed images.

FIG. 2 to FIG. 6 are cross-sectional views showing an example of a method for manufacturing the color conversion panel 30 described with reference to FIG. 1.

Figure 2:
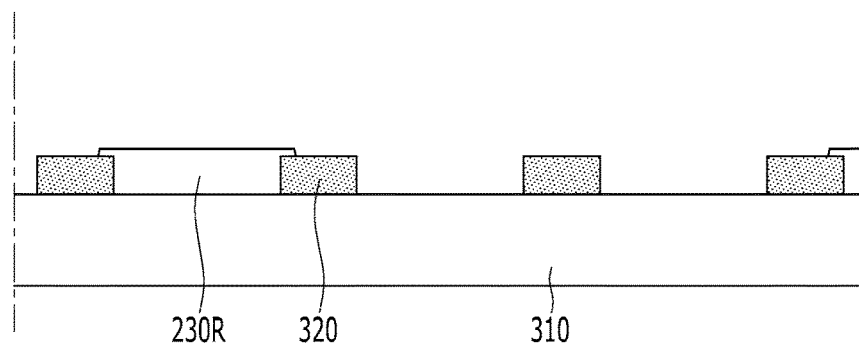
FIG. 2, FIG. 3, FIG. 4, FIG. 5, and FIG. 6 are cross-sectional views showing an example of a method for manufacturing a color conversion panel described with reference to FIG. 1.

Referring to FIG. 2, a light blocking member 320 may be formed on a substrate 310, and a first color filter 230R may be formed. The light blocking member 320 may be formed by a photo (lithography) process.

The first color filter 230R may be a red color filter and may be formed by a photo process. The first color filter 230R may be formed between adjacent light blocking members 320. The first color filter 230R may overlap an edge part of the light blocking member 320. In an embodiment, the first color filter 230R may have a width that is equal to or narrower than the interval between immediately adjacent light blocking members 320.

Figure 3:
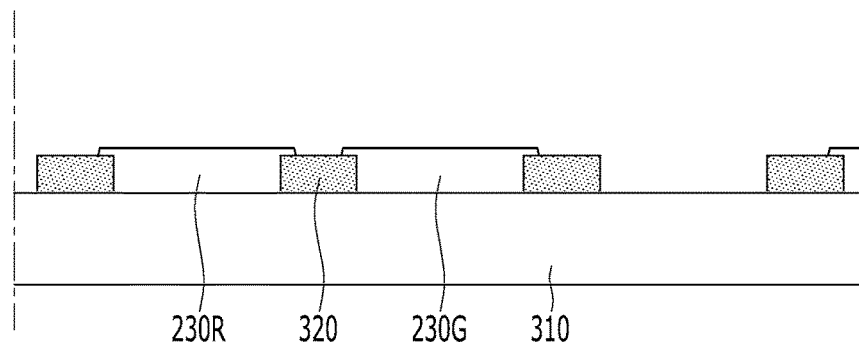

Referring to FIG. 3, a second color filter 230G may be formed on the substrate 310 adjacent to the first color filter 230R. The second color filter 230G may be a green color filter and may be formed by the same method used for forming the red color filter.

Figure 4:
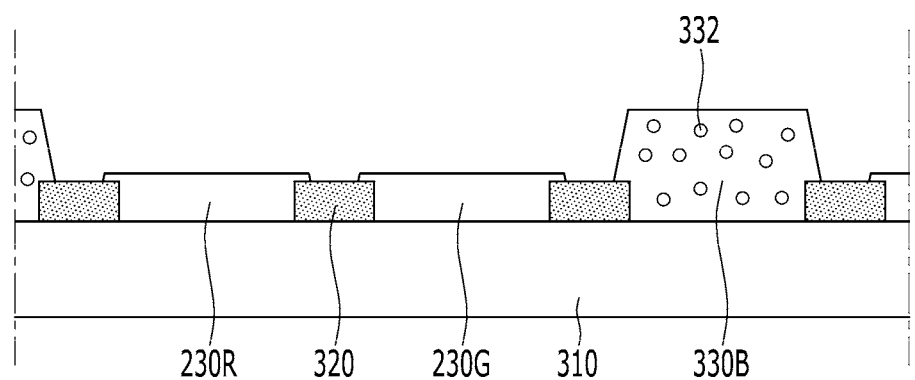

Referring to FIG. 4, a blue-color layer 330B (or transmission layer 330B) including a scattering member 332 may be formed on the substrate 310 adjacent to the first color filter 230R and the second color filter 230G.

Figure 5:
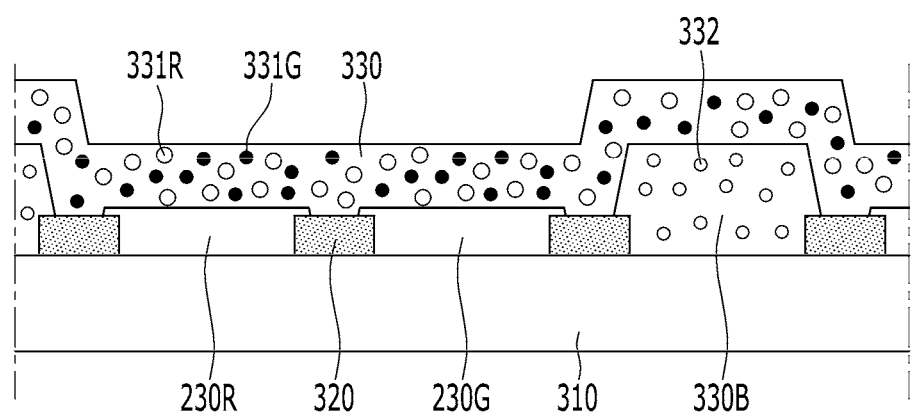

Referring to FIG. 5, a color conversion material layer 330 may be formed on the substrate 310 to cover the light blocking member 320, the first color filter 230R, the second color filter 230G, and the transmission layer 330B. The color conversion material layer 330 may include a plurality of red quantum dots 331R and a plurality of green quantum dots 331G. The color conversion material layer 330 may include a photosensitive resin.

Figure 6:
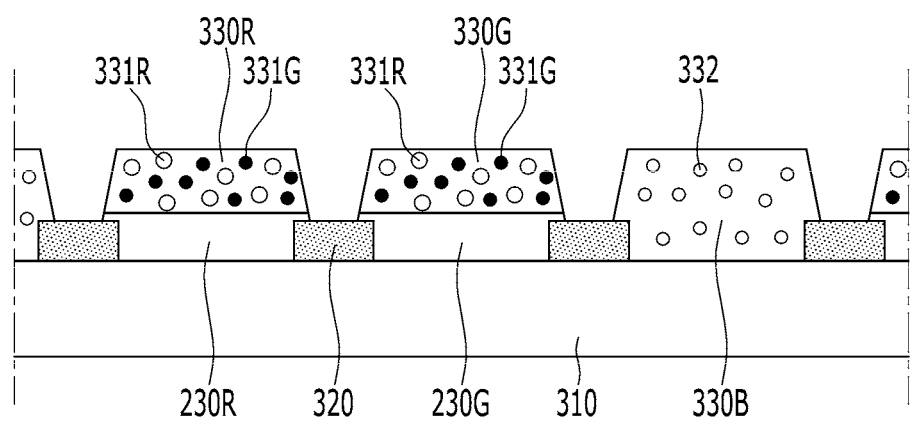

Referring to FIG. 6, the color conversion material layer 330 of FIG. 5 having the photosensitivity may be patterned (and partially removed) by a photo process to form a first color conversion layer 330R and a second color conversion layer 330G. In embodiments, the upper surface of the light blocking member 320 may be exposed. In embodiments, the first color conversion layer 330R and the second color conversion layer 330G are simultaneously formed while the color conversion material layer 330 illustrated in FIG. 5 is patterned, thereby having substantially the same thickness. Accordingly, planarization of subsequently-formed structures may be facilitated.

Next, to cover the light blocking member 320, the color conversion layers 330R and 330G, and the transmission layer 330B, a capping layer and a planarization layer are sequentially formed on the substrate 310, resulting in the color conversion panel 30 illustrated in FIG. 1.

Figure 7:
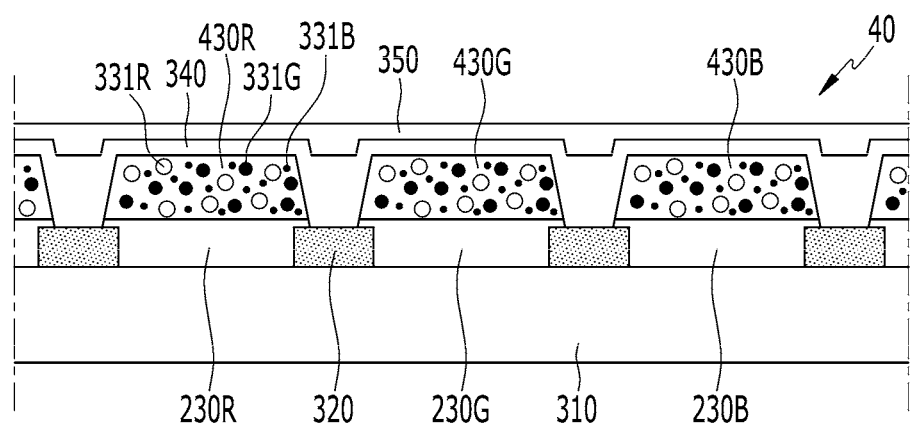
FIG. 7 is a cross-sectional view showing a color conversion panel according to an embodiment.

FIG. 7 is a cross-sectional view showing a color conversion panel according to an embodiment.

In embodiments, referring to FIG. 1, a light incident to the color conversion panel 30 may be a blue light, a white light, and/or an ultraviolet ray (UV) light. In embodiments, referring to FIG. 7, a white light and/or an ultraviolet ray light may be incident to the color-conversion panel 40 (or color conversion panel 40).

Some structures of the color conversion panel 40 illustrated in FIG. 7 may be identical to or analogous to structures of the color conversion panel 30 illustrated in FIG. 1.

Referring to FIG. 7, in embodiments, a dual layer structure including a third color filter 230B and an overlying third color conversion layer 430B (instead of the transmission layer 330B of the color conversion panel 30 illustrated in FIG. 1) is formed.

The first color-conversion layer 430R (or first color conversion layer 430R) disposed on the first color filter 230R includes a first set of red quantum dots 331R, a first set of green quantum dots 331G, and a first set of blue quantum dots 331B. Accordingly, the white light or the ultraviolet rays incident to the first color conversion layer 430R is converted into red light, green light, and blue light by the red quantum dots 331R, the green quantum dots 331G, and the blue quantum dots 331B. The red light, green light, and blue light may be emitted from the first color conversion layer 430R.

Like the first color conversion layer 430R, a second color-conversion layer 430G (or second color conversion layer 430G) and a third color-conversion layer 430B (or third color conversion layer 430B) each also may include a set of red quantum dots 331R, a set of green quantum dots 331G, and a set of blue quantum dots 331B, such that color-converted light may be emitted from the second color conversion layer 430G and the third color conversion layer 430B.

The first color conversion layer 430R, the second color conversion layer 430G, and the third color conversion layer 430B may have substantially the same thickness. The first color conversion layer 430R, the second color conversion layer 430G, and the third color conversion layer 430B may be simultaneously formed in the same patterning process and may have substantially the same thickness as a result of this process.

Figure 8:
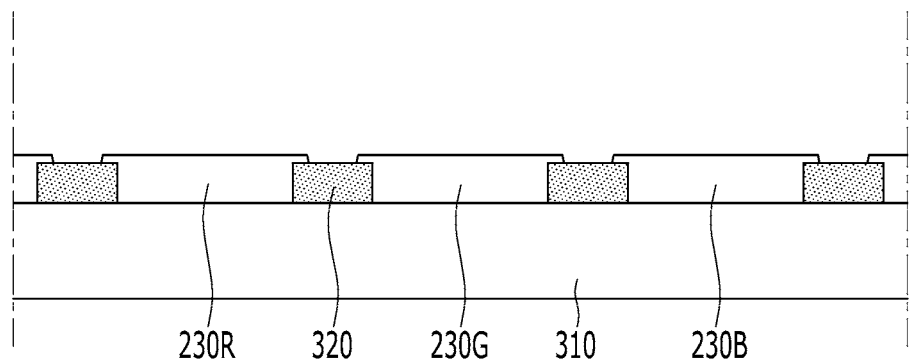
FIG. 8, FIG. 9, and FIG. 10 are cross-sectional views showing an example of a method for manufacturing a color conversion panel described with reference to FIG. 7.
Figure 9:
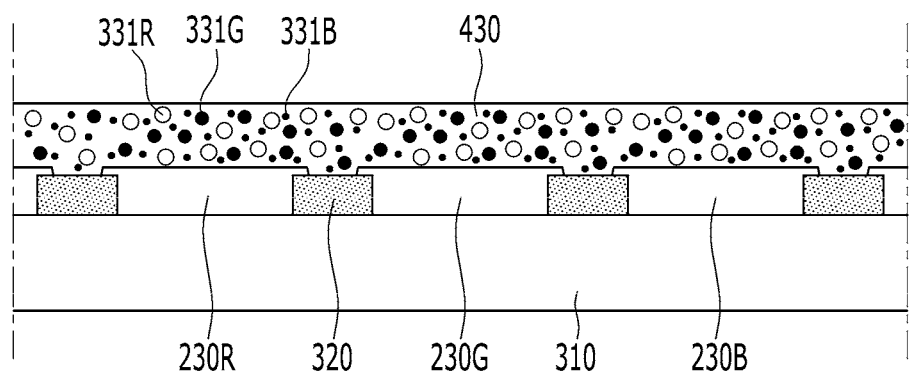
Figure 10:
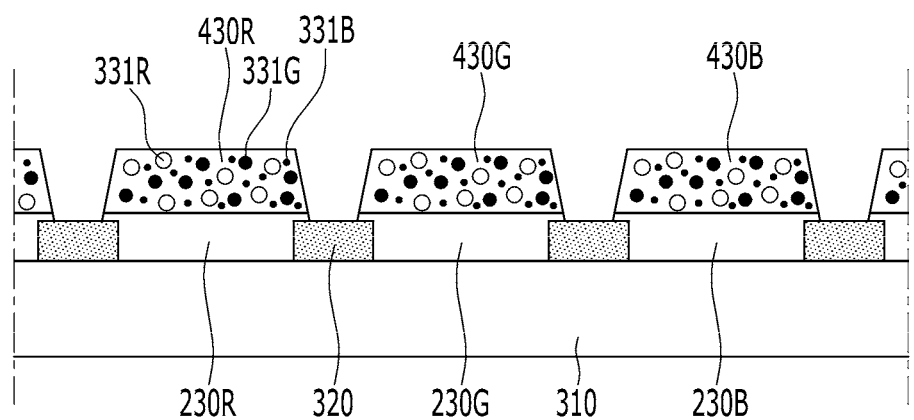

FIG. 8 to FIG. 10 are cross-sectional views showing an example of a method for manufacturing the color conversion panel 40 described with reference to FIG. 7.

Referring to FIG. 8, light blocking members 320 may be formed on a substrate 310; and a first color filter 230R, a second color filter 230G, and a third color filter 230B may be sequentially formed between immediately adjacent light blocking members 320. The order of forming the first color filter 230R, the second color filter 230G, and the third color filter 230B may be determined according to embodiments.

Referring to FIG. 9, a color conversion material layer 430 may be formed on the substrate 310 to cover the light blocking members 320 and the color filters 230R, 230G, and 230B. The color conversion material layer 430 may include a plurality of red quantum dots 331R, a plurality of green quantum dots 331G, and a plurality of blue quantum dots 331B. The color conversion material layer 430 may include the photosensitive resin.

Referring to FIG. 10, the color conversion material layer 430 of FIG. 9 having photosensitivity may be patterned (and partially removed) by a photo process to form a first color conversion layer 430R, a second color conversion layer 430G, and a third color conversion layer 430B. In embodiments, the upper surfaces of the light blocking members 320 may be exposed. In embodiments, the first color conversion layer 430R, the second color conversion layer 430G, and the third color conversion layer 430B are simultaneously formed as a result of removal of portions of the color conversion material layer 430 illustrated in FIG. 9 and may have substantially the same thickness. Accordingly, planarization of subsequently-formed structures may be facilitated.

Next, a capping layer and a planarization layer are sequentially formed on the substrate 310 to cover the light blocking members 320 and the color conversion layers 430R, 430G, and 430B, resulting in the color conversion panel illustrated in FIG. 7.

Figure 11:
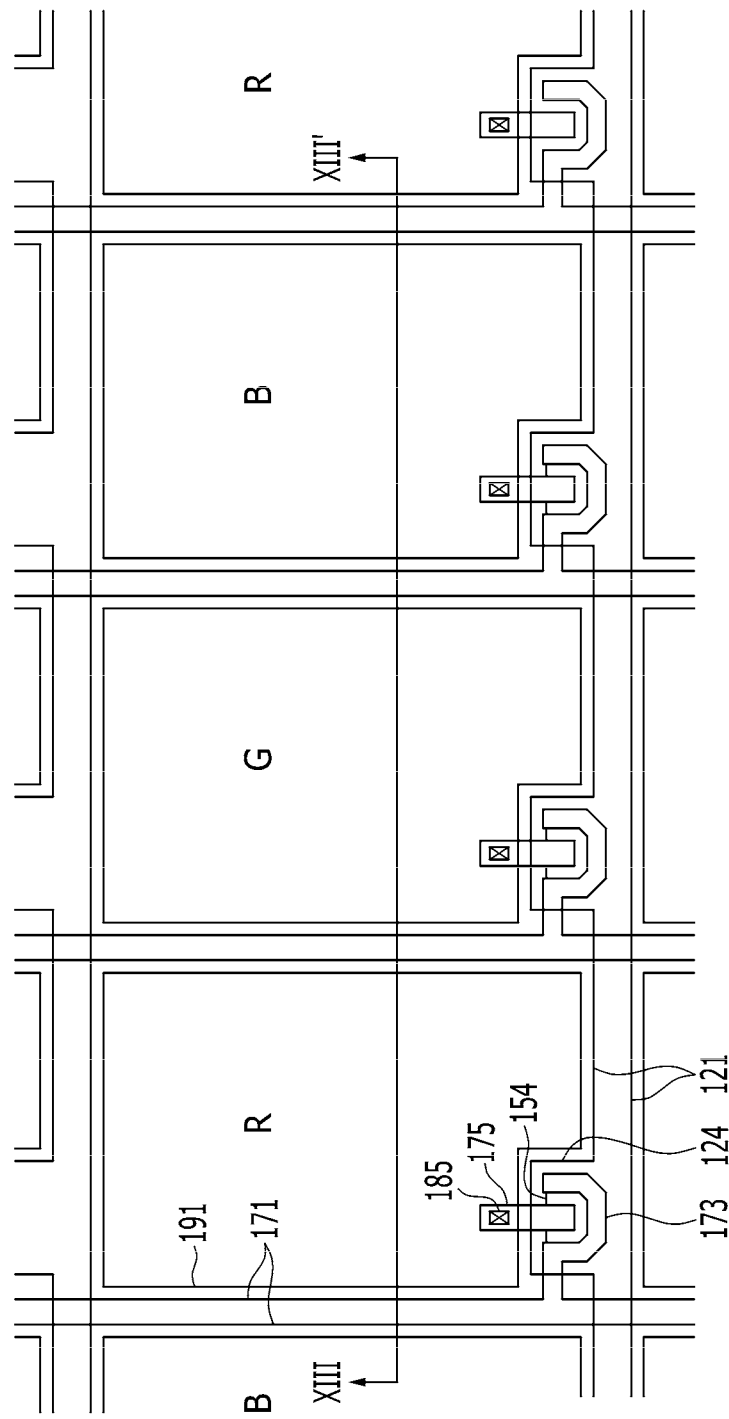
FIG. 11 is a top plan view of display device, e.g., a liquid crystal display device, according to an embodiment.
Figure 12:
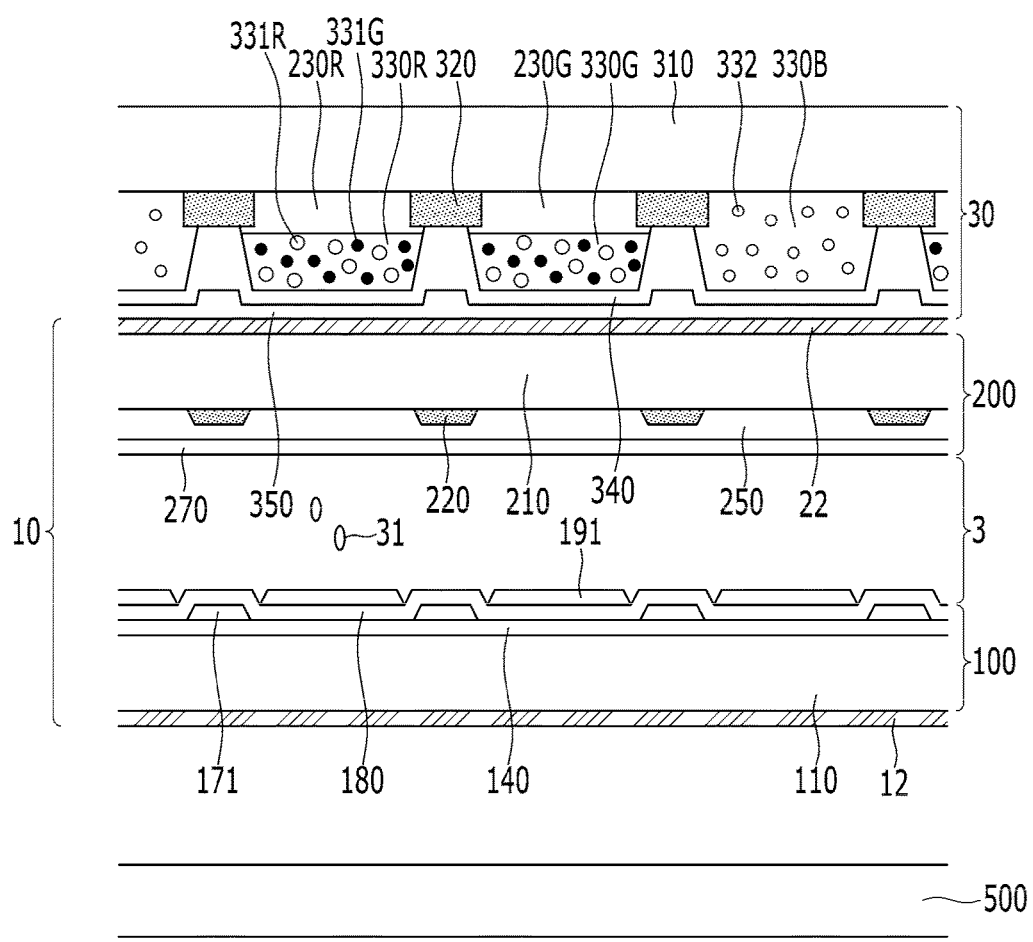
FIG. 12 is a cross-sectional view taken along line XIII-XIII' of FIG. 11 according to an embodiment.

FIG. 11 is a top plan view of a display device, e.g., a liquid crystal display device, according to an embodiment. FIG. 12 is a cross-sectional view taken along line XIII-XIII' of FIG. 11.

Referring to FIG. 11 and FIG. 12, the display device (e.g., a liquid crystal display device) includes a light unit 500, a light-control panel 10 (or display panel 10 for controlling transmission, emission, and/or reflection of light), and a color conversion panel 30. In embodiments, the display panel 10 may be disposed between the color conversion panel 30 and the light unit 500.

The light unit 500 may include a light source generating light and a light guide (not shown) for receiving the light generated from the light source and guiding the light toward the display panel 10 and the color conversion panel 30.

The light unit 500 may include at least one light emitting diode (LED), for example, a blue light emitting diode (LED). In embodiments, the light unit may include a white light source, an ultraviolet ray light source, and/or a blue light emitting diode (LED).

The display panel 10 according to the present embodiment includes a lower panel 100, an upper panel 200 overlapping and separated from the lower panel 100, a first polarizer 12 disposed under the lower panel 100, a second polarizer 22 disposed on the upper panel 200, and a liquid crystal layer 3 disposed between the lower panel 100 and the upper panel 200. The first polarizer 12 and the second polarizer 22 may polarize the light incident from the light unit 500.

Next, the lower panel 100 will be described.

On a first substrate 110, a gate line 121 extending in a row direction and including a gate electrode 124, a gate insulating layer 140 disposed on the gate line 121, a semiconductor layer 154 disposed on the gate insulating layer 140, a data line 171 disposed on the semiconductor layer 154 and extending in a column direction, a source electrode 173 connected to the data line 171, a drain electrode 175 facing the source electrode 173, a passivation layer 180 disposed on the data line 171 and the drain electrode 175, and a pixel electrode 191 electrically connected to the drain electrode 175 through a contact hole 185.

The pixel electrode 191 is disposed in a matrix shape, and the shape and the arrangement of the pixel electrode 191 may be changed.

The semiconductor layer 154 disposed on the gate electrode 124 forms a channel layer between the source electrode 173 and the drain electrode 175, and the gate electrode 124, the semiconductor layer 154, the source electrode 173, and the drain electrode 175 form one thin film transistor.

Next, the upper panel 200 will be described.

A second substrate 210 faces and is separated from the first substrate 110. A black matrix 220, an overcoat 250, and a common electrode 270 are disposed between the second substrate 210 and the liquid crystal layer 3. In detail, the black matrix 220 is disposed between the liquid crystal layer 3 and the second substrate 210. The overcoat 250 is disposed between the liquid crystal layer 3 and the second substrate 210 while covering the black matrix 220. The common electrode 270 is disposed between the liquid crystal layer 3 and the overcoat 250.

Although not shown, an alignment layer may be formed between the liquid crystal layer 3 and the pixel electrode 191 and between the liquid crystal layer 3 and the common electrode 270.

The common electrode 270 receiving a common voltage forms an electric field along with the pixel electrode 191, and each long axis of liquid crystal molecules 31 disposed in the liquid crystal layer 3 is inclined in a direction perpendicular or parallel to a direction of the electric field. The degree of the polarization of the light that is incident to the liquid crystal layer 3 is changed depending on the inclination degree of the liquid crystal molecules 31, and this change of polarization appears as a change of transmittance by the polarizer, thereby the liquid crystal display displays the images.

The color conversion panel 30 disposed on the display panel 10 may be the color conversion panel 30 described with reference to FIG. 1. In embodiments, the color conversion panel 30 shown in FIG. 1 in an inverted state may be disposed on the display panel 10 so as to position the substrate 310 of the color conversion panel 30 far from a highest end of the display panel 10. In embodiments, the color conversion panel 40 described with reference to FIG. 7 (in addition to or instead of the color conversion panel 30) may be included in the display device.

This display device may have satisfactory color reproducibility and satisfactory contrast ratios enabled by the color conversion panel 30 or 40.

Figure 13:
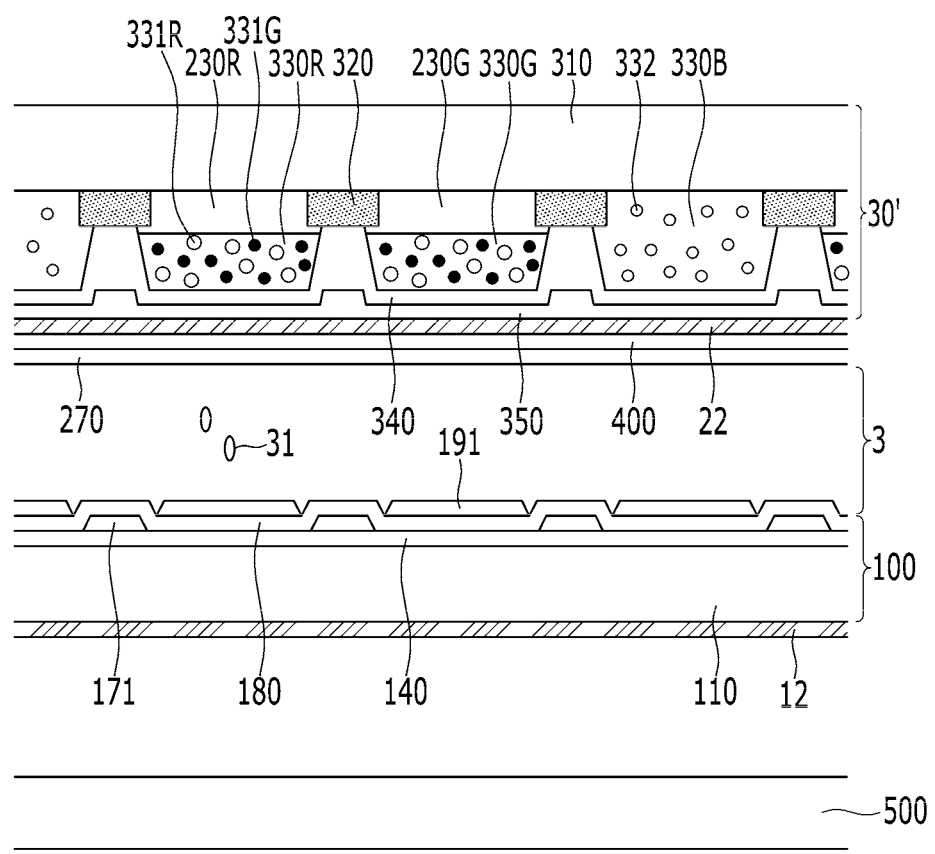
FIG. 13 is a cross-sectional view taken along line XIII-XIII' of FIG. 11 according to an embodiment.

FIG. 13 is a cross-sectional view taken along line XIII-XIII' of FIG. 11 according to an embodiment.

The display device, e.g., a liquid crystal display device includes a light unit 500, a lower panel 100, a liquid crystal layer 3, and a color conversion panel 30'. The display device further includes a first polarizer 12 disposed under the lower panel 100, a common electrode 270 disposed between the liquid crystal layer 3 and the color conversion panel 30', and a second polarizer 22.

The display device illustrated in FIG. 13 may include structures identical to or analogous to structures described with reference to FIG. 12.

The liquid crystal layer 3 including the liquid crystal molecules 31 is disposed between the lower panel 100 and the color conversion panel 30'.

The common electrode 270 is disposed on the liquid crystal layer 3 and the second polarizer 22 is disposed between the common electrode 270 and the color conversion panel 30', thereby forming an in-cell polarizer. In this case, for electrical insulation of the common electrode 270 and the second polarizer 22, an insulating layer 400 may be interposed between the common electrode 270 and the second polarizer 22.

The display device illustrated in FIG. 13 does not include the upper panel 200 shown in FIG. 12, and the color conversion panel 30' may function as an upper panel. The display device may have a minimum thickness and/or a minimum weight and may require a minimum manufacturing cost.

In embodiments, a color-conversion panel 30, a color-conversion panel 40, and/or a color-conversion panel 30' may be included in an organic light emitting diode display device. The organic light emitting diode display device may include an emission layer that emits blue or white light.

In embodiments, a color-conversion panel 30, a color-conversion panel 40, and/or a color-conversion panel 30' may be included in an emissive display device (micro-LED), which may have a plurality of light emitting diodes (LED) formed on a substrate.

While example embodiments have been described, possible embodiments are not limited to the described embodiments. Possible embodiments cover various modifications and equivalent arrangements within the spirit and scope of the appended claims.

What is claimed is:

1. A color conversion panel comprising:
   a substrate;
   a first color filter and a second color filter adjacent to the first color filter disposed on the substrate;
   a first color conversion layer disposed on the first color filter and comprising a first side and second side, wherein a material of the first side is identical to the second side, and wherein the first side is disposed between the first color filter and the second side in a first direction, and wherein the first direction is perpendicular to the substrate;
   a second color conversion layer disposed on the second color filter;
   a third color layer disposed on the substrate and comprising a first face and a second face, wherein a material of the first face is identical to a material of the second face, wherein the first face is disposed between the substrate and the second face in the first direction, and wherein the second face is disposed farther than the first side from the substrate;
   a light blocking member disposed between the first color filter and the second color filter and comprising a first edge and a second edge,
   wherein the second edge is disposed between the first edge and the first side in the first direction, is disposed farther than the first face from the substrate, and is disposed closer than the second face to the substrate,
   wherein each of the first color conversion layer and the second color conversion layer includes at least two quantum dots representing different colors, and
   wherein the first color filter displays a different color from the second color filter.

2. The color conversion panel of claim 1, wherein the first color conversion layer and the second color conversion layer have substantially the same thickness.

3. The color conversion panel of claim 2, wherein the at least two quantum dots include a red quantum dot and a green quantum dot.

4. The color conversion panel of claim 1, further comprising:
   wherein the third color layer displays a different color from the first color filter and the second color filter.

5. The color conversion panel of claim 4, wherein the third color layer comprises a set of light-scattering members configured to scatter light.

6. The color conversion panel of claim 5, wherein the third color layer further comprises a blue pigment.

7. The color conversion panel of claim 4, wherein the third color layer is thicker than each of the first color conversion layer and the second color conversion layer.

8. The color conversion panel of claim 4, wherein the third color layer comprises a third color filter and a third color conversion layer disposed on the third color filter,
   wherein the third color conversion layer includes a blue quantum dot.

9. The color conversion panel of claim 8, wherein
the first color conversion layer, the second color conversion layer, and the third color conversion layer respectively include a red quantum dot, a green quantum dot, and a blue quantum dot.

10. The color conversion panel of claim 9, wherein the third color conversion layer directly contacts the third color filter, and
wherein the first color conversion layer, the second color conversion layer, and the third color conversion layer have substantially the same thickness.

11. A method for manufacturing a color conversion panel, comprising:
forming a light blocking member on a substrate;
forming a first color filter, a second color filter and a third color layer on the substrate;
forming a color conversion material layer on the substrate to cover the first color filter and the second color filter, wherein two opposite faces of the color conversion material layer respectively directly contact two opposite faces of the third color layer; and
patterning the color conversion material layer to form a first color conversion layer on the first color filter and a second color conversion layer on the second color filter,
wherein each of the first color conversion layer and the second color conversion layer includes at least two quantum dots representing different colors, and
wherein the first color filter displays a different color from the second color filter.

12. The method of claim 11, wherein
the at least two quantum dots include a red quantum dot and a green quantum dot.

13. The method of claim 11, wherein the third color layer displays a different color from the first color filter and the second color filter.

14. The method of claim 13, wherein the third color layer comprises a set of light-scattering members configured to scatter light.

15. The method of claim 13, wherein the color conversion material layer covers the third color layer.

16. The method of claim 13, wherein the third color layer further comprises a blue pigment.

17. The method of claim 13, wherein the first color conversion layer and the second color conversion layer are simultaneously formed.

18. The method of claim 13, wherein forming a third color layer comprising:
forming a third color filter on the substrate, and
patterning the color conversion material layer to form a third color conversion layer on the third color filter,
wherein the first color conversion layer, the second color conversion layer, and the third color conversion layer respectively include a red quantum dot, a green quantum dot, and a blue quantum dot.

19. The method of claim 18, wherein
the first color conversion layer, the second color conversion layer, and the third color conversion layer are simultaneously formed.

20. A display device comprising:
a display panel; and
a color conversion panel overlapping the display panel,
wherein the color conversion panel includes
a substrate,
a first color filter and a second color filter disposed at one surface of the substrate toward the display panel,
a first color conversion layer disposed at one surface of the first color filter toward the display panel, and
a second color conversion layer disposed at one surface of the second color filter toward the display panel,
a third color layer disposed on one surface of the substrate toward the display panel, and
a light blocking member disposed between the first color filter and the second color filter,
wherein a portion of the first color filter is disposed between the light blocking member and the first color conversion layer in a first direction,
wherein the first direction is perpendicular to the substrate,
wherein a sum of a thickness of the light blocking member in the first direction, a thickness of the portion of the first color filter in the first direction, and a thickness of the first color conversion layer in the first direction is equal to a thickness of the third color layer in the first direction,
wherein each of the first color conversion layer and the second color conversion layer includes at least two quantum dots representing different colors, and
wherein the first color filter displays a different color from the second color filter.

* * * * *